(12) United States Patent
Takebayashi et al.

(10) Patent No.: US 12,243,764 B2
(45) Date of Patent: Mar. 4, 2025

(54) ELECTROSTATIC CHUCK

(71) Applicant: NGK INSULATORS, LTD., Nagoya (JP)

(72) Inventors: Hiroshi Takebayashi, Handa (JP); Yuma Iwata, Ichinomiya (JP)

(73) Assignee: NGK INSULATORS, LTD., Nagoya (JP)

( * ) Notice: Subject to any disclaimer, the term of this patent is extended or adjusted under 35 U.S.C. 154(b) by 729 days.

(21) Appl. No.: 17/304,749

(22) Filed: Jun. 25, 2021

(65) Prior Publication Data

US 2021/0320025 A1    Oct. 14, 2021

Related U.S. Application Data

(63) Continuation of application No. PCT/JP2020/009189, filed on Mar. 4, 2020.

(30) Foreign Application Priority Data

Mar. 18, 2019  (JP) .................................. 2019-050246

(51) Int. Cl.
*H01L 21/683* (2006.01)

(52) U.S. Cl.
CPC ................................ *H01L 21/6833* (2013.01)

(58) Field of Classification Search
CPC .................................................. H01L 21/6833
See application file for complete search history.

(56) References Cited

U.S. PATENT DOCUMENTS 6,243,251 B1    6/2001  Kanno et al.
7,283,346 B2 *  10/2007  Yoshida .............. H01L 21/6833
                                                        361/230
(Continued)

FOREIGN PATENT DOCUMENTS

JP    H04-237148 A1    8/1992
JP    2003-007810 A1   1/2003
(Continued)

OTHER PUBLICATIONS

International Search Report and Written Opinion (Application No. PCT/JP2020/009189) dated May 19, 2020.
(Continued)

*Primary Examiner* — Eric A. Gates
*Assistant Examiner* — Reinaldo A Del Vargas Rio
(74) *Attorney, Agent, or Firm* — BURR PATENT LAW, PLLC

(57) ABSTRACT

An electrostatic chuck includes a ceramic plate through holes which penetrate the plate, and a pair of positive and negative electrodes. The plate has division areas virtually divided, which are equal in number to the number of the through holes. The positive electrode and the negative electrode have pairs of positive and negative helical electrode portions, and for each of the division areas, one of the pairs is provided in parallel so as to cover the entirety of the division area from each of a positive electrode start point and a negative electrode start point which are close to one of the through holes. The positive electrode is such that the positive helical electrode portions are connected via outer circumferential portions of the plate, and the negative electrode is such that the negative helical electrode portions are connected via a central portion of the plate.

10 Claims, 3 Drawing Sheets

(56) References Cited

U.S. PATENT DOCUMENTS

| | | | |
|---|---|---|---|
| 9,093,488 B2* | 7/2015 | Anada | H01L 21/6833 |
| 11,024,529 B2* | 6/2021 | White | H01L 21/6833 |
| 2002/0006680 A1 | 1/2002 | Katala et al. | |
| 2004/0233609 A1 | 11/2004 | Yoshida et al. | |
| 2008/0037195 A1 | 2/2008 | Himori et al. | |
| 2008/0062609 A1 | 3/2008 | Himori et al. | |
| 2015/0371885 A1 | 12/2015 | Tamagawa et al. | |

FOREIGN PATENT DOCUMENTS

| | | | | |
|---|---|---|---|---|
| JP | 2004111107 A * | 4/2004 | | H01L 21/67103 |
| JP | 2008-042140 A | 2/2008 | | |
| JP | 2016-009715 A1 | 1/2016 | | |
| JP | 2017195276 A * | 10/2017 | | |

OTHER PUBLICATIONS

Taiwanese Office Action (Application No. 109107654) dated Dec. 30, 2020.
English translation of the International Preliminary Report on Patentability (Chapter I) dated Sep. 30, 2021 (Application No. PCT/JP2020/009189).
Chinese Office Action (Application No. 202080021416.5) dated Jun. 1, 2023 (7 pages).

* cited by examiner

ELECTROSTATIC CHUCK

BACKGROUND OF THE INVENTION

1. Field of the Invention

The present invention relates to an electrostatic chuck.

2. Description of the Related Art

An electrostatic chuck is used to suck and hold a wafer utilizing an electrostatic force during a semiconductor manufacturing process. For example, PTL 1 discloses such an electrostatic chuck in which a pair of positive and negative thin film electrodes are pattern-formed on a ceramic circular plate. Herein, the pattern shape of each electrode has a tine shape with an outer circumferential edge in an arc shape, and is formed by alternately meshing belt-shaped tines of both electrodes to each other.

CITATION LIST

Patent Literature

PTL 1: JP 4-237148 A

SUMMARY OF THE INVENTION

However, as in PTL 1, in the electrostatic chuck formed by alternately meshing belt-shaped tines of both electrodes to each other, when a plurality of lift pin holes each to insert a lift pin for raising and lowering a wafer are attempted to be installed, the shape of the tines needs to be changed to avoid the lift pin holes. Specifically, as shown in FIG. 3, tines 106 of the positive electrode and tines 108 of the negative electrode around a lift pin hole 110 need to be formed in an arc shape to avoid the lift pin hole 110. In this manner, the avoiding of the lift pin hole 110 affects to the outward tines 106, 108, and disturbance in the regularity of the electrode pattern occurs, thus variation in suction power in the wafer placement surface may be caused.

The present invention has been devised to solve such a problem, and it is a main object to reduce the variation in suction power in the wafer placement surface.

An electrostatic chuck of the present invention includes:
a ceramic plate having a wafer placement surface;
a plurality of through holes which penetrate the plate in a thickness direction; and
a pair of positive and negative electrodes provided in the plate to generate an electrostatic force,
wherein the plate has division areas virtually divided, which are equal in number to a number of the through holes,
the pair of positive and negative electrodes have pairs of positive and negative helical electrode portions, and for each of the division areas, one of the pairs is provided in parallel so as to cover an entirety of the division area from each of a positive electrode start point and a negative electrode start point which are close to one of the through holes,
the positive electrode of the pair of positive and negative electrodes is such that the positive helical electrode portions of the division areas are connected via either one of a central portion and an outer circumferential portion of the plate, and
the negative electrode of the pair of positive and negative electrodes is such that the negative helical electrode portions of the division areas are connected via the other of the central portion and the outer circumferential portion of the plate.

In the electrostatic chuck, the ceramic plate is virtually divided into a certain number of division areas, the certain number being equal to the number of the through holes. The pair of positive and negative electrodes have pairs of positive and negative helical electrode portions, and for each of the division areas, one of the pairs is provided in parallel so as to cover the entirety of the division area from each of a positive electrode start point and a negative electrode start point which are close to a through hole. The positive helical electrode portion and the negative helical electrode portion have a form of being meshed to each other alternately. Also, the positive electrode is such that the positive helical electrode portions of the division areas are connected via either one of a central portion and an outer circumferential portion of the plate, and the negative electrode is such that the negative helical electrode portions of the division areas are connected via the other of the central portion and the outer circumferential portion of the plate. Thus, it is not necessary for the positive electrode and the negative electrode to avoid each through hole along an arc shape around the through hole, and the regularity of the electrode pattern can be maintained favorably. Therefore, it is possible to reduce the variation in suction power in the wafer placement surface.

In the electrostatic chuck of the present invention, the diameter of the through hole may be greater than or equal to the interelectrode distance between the positive electrode and the negative electrode adjacent to each other. In this case, when a through hole is attempted to be provided between the adjacent positive electrode and negative electrode, at least one of the pair of positive and negative electrodes interferes with the through hole, thus needs to detour the through hole. Therefore, the significance of application of the present invention is high.

Meanwhile, the linewidth of the positive electrode is the same as the linewidth of the negative electrode, and the diameter of the through hole may be greater than or equal to the sum of the interelectrode distance and the linewidth. In this case, at least one of the pair of positive and negative electrodes needs to further detour the through hole, thus the significance of application of the present invention is high.

In the electrostatic chuck of the present invention, the plate may be circular, the plurality of through holes may be provided equally spaced on a circle concentric with the plate, and the division areas may be such that the plate is equally divided by line segments in a radial direction of the plate, and the division areas may be equal in number to the number of the through holes. Such through holes include a hole to insert a lift pin for raising and lowering a wafer, for instance. Note that the "equally spaced" does not necessarily refers to exactly equally spaced, and may include an error (for example, ±2 to 3%). The same goes with the "equally divided".

DETAILED DESCRIPTION OF THE INVENTION

Figure 1:
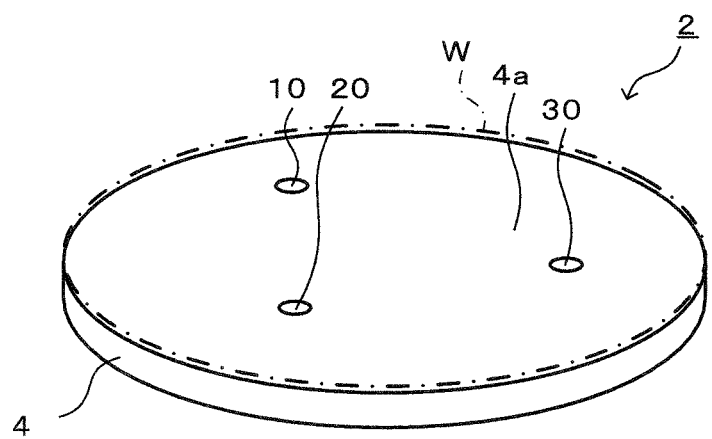
FIG. 1 is a perspective view of an electrostatic chuck 2.
Figure 2:
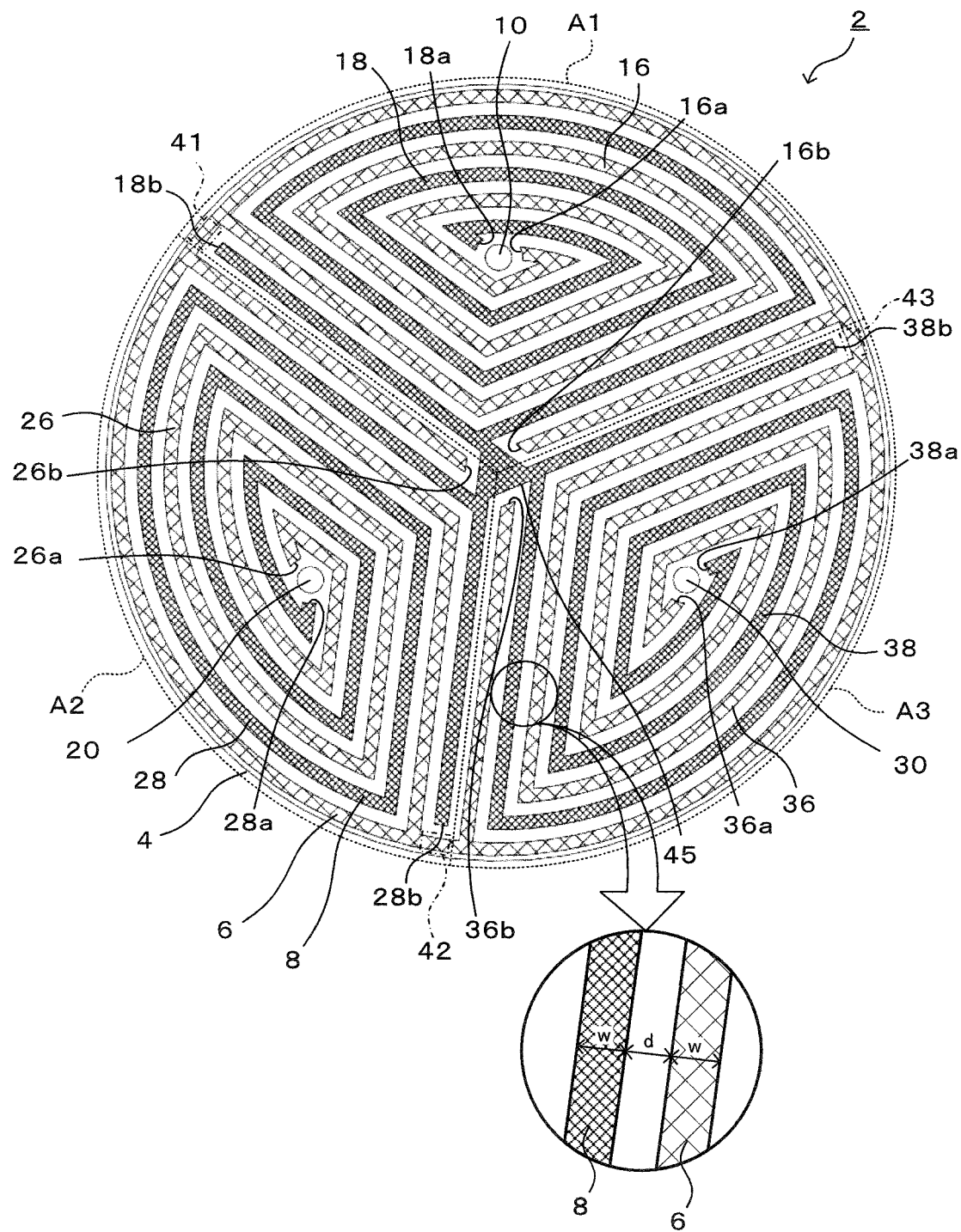
FIG. 2 is a cross-sectional view when a plate 4 is cut by a plane including a positive electrode 6 and a negative electrode 8.
Figure 3:
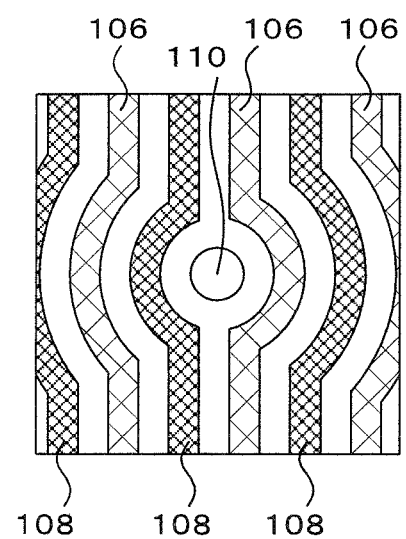
FIG. 3 is an explanatory view showing the appearance of tines 106, 108 around a lift pin hole 110.

A preferred embodiment of the present invention will be described below with reference to the drawings. FIG. 1 is a perspective view of an electrostatic chuck 2, and FIG. 2 is a cross-sectional view when a plate 4 is cut by a plane including a positive electrode 6 and a negative electrode 8. Note that, in FIG. 2, hatching of a cross-section of the plate 4 is omitted for the sake of convenience.

The electrostatic chuck 2 includes the plate 4, lift pin holes 10, 20, 30, division areas A1 to A3, and a pair of positive and negative electrodes (the positive electrode 6 and the negative electrode 8) for electrostatic suction.

The plate 4 is a circular plate made of ceramic (for example, made of alumina or made of aluminum nitride). The surface of the plate 4 is provided with a wafer placement surface 4a for placing a wafer W.

The lift pin holes 10, 20, 30 are holes which penetrate the plate 4 in a thickness direction, and are provided equally spaced on a circle concentric with the plate 4.

The division areas A1, A2, A3 are such that the plate 4 is virtually divided into the areas (the areas surrounded by a dotted line in FIG. 2), which are equal in number to the number of the lift pin holes 10, 20, 30. In the present embodiment, the division areas A1, A2, A3 are such that the circular plate 4 is equally divided into three sector areas by line segments in a radial direction of the plate 4, each sector area having a central angle of approximately 120°.

The positive electrode 6 is such that positive helical electrode portions 16, 26, 36 of the division areas A1, A2, A3 are connected via connection portions 41, 42, 43, and the negative electrode 8 is such that negative helical electrode portions 18, 28, 38 of the division areas A1, A2, A3 are connected via a connection portion 45.

In the sector division area A1, a pair of the positive and negative helical electrode portions 16, 18 are provided in parallel from a positive electrode start point 16a and a negative electrode start point 18a close to the lift pin hole 10 to respective positive electrode end point 16b and negative electrode end point 18b so as to cover the entirety of the division area A1. Thus, the positive helical electrode portion 16 and the negative helical electrode portion 18 in the division area A1 are alternately meshed to each other. The helical shape of the helical electrode portions 16, 18 is substantially similar to the sector of the division area A1.

In the sector division area A2, a pair of the positive and negative helical electrode portions 26, 28 are provided in parallel from a positive electrode start point 26a and a negative electrode start point 28a close to the lift pin hole 20 to respective positive electrode end point 26b and negative electrode end point 28b so as to cover the entirety of the division area A2. Thus, the positive helical electrode portion 26 and the negative helical electrode portion 28 in the division area A2 are alternately meshed to each other. The helical shape of the helical electrode portions 26, 28 is substantially similar to the sector of the division area A2.

In the sector division area A3, a pair of the positive and negative helical electrode portions 36, 38 are provided in parallel from a positive electrode start point 36a and a negative electrode start point 38a close to the lift pin hole 30 to respective positive electrode end point 36b and negative electrode end point 38b so as to cover the entirety of the division area A3. Thus, the positive helical electrode portion 36 and the negative helical electrode portion 38 in the division area A3 are alternately meshed to each other. The helical shape of the helical electrode portions 36, 38 is substantially similar to the sector of the division area A3.

The positive helical electrode portion 16 of the division area A1 and the positive helical electrode portion 26 of the division area A2 are connected via a connection portion 41 provided on the outer circumferential portion of the plate 4, the positive helical electrode portion 26 of the division area A2 and the positive helical electrode portion 36 of the division area A3 are connected via a connection portion 42 provided on the outer circumferential portion of the plate 4, and the positive helical electrode portion 36 of the division area A3 and the positive helical electrode portion 16 of the division area A1 are connected via a connection portion 43 provided on the outer circumferential portion of the plate 4. The positive electrode 6 is such that the positive helical electrode portion 16, 26, 36 of the division areas A1, A2, A3 are thus connected via the connection portions 41, 42, 43 on the outer circumferential portion of the plate 4.

The negative helical electrode portion 18 of the division area A1, the negative helical electrode portion 28 of the division area A2, and the negative helical electrode portion 38 of the division area A3 are connected via a triangular connection portion 45 provided at a central portion of the plate 4. The negative electrode 8 is such that the negative helical electrode portion 18, 28, 38 of the division areas A1, A2, A3 are thus connected via the connection portion 45 at a central portion of the plate 4.

The diameter $\varphi$ of the lift pin holes 10, 20, 30 is greater than or equal to the interelectrode distance d between the positive electrode 6 and the negative electrode 8 adjacent to each other ($\varphi \geq d$). In addition, the linewidth w of the positive electrode 6 is the same as the linewidth w of the negative electrode 8. The sum (w+d) of the linewidth w and the interelectrode distance d is preferably greater than or equal to 1 mm and less than or equal to 4 mm. The interelectrode distance d is preferably less than or equal to 2 mm. The diameter $\varphi$ of each of the lift pin holes 10, 20, 30 is preferably more than or equal to 1 mm.

Next, an example of use of the electrostatic chuck 2 will be described. The electrostatic chuck 2 is used by being placed on a chamber which is not shown. A disc-shaped wafer W is placed on the wafer placement surface 4a of the electrostatic chuck 2. Application of a voltage across the positive electrode 6 and the negative electrode 8 causes the wafer W to be sucked to the wafer placement surface 4a by an electrostatic force. The electrostatic force includes Coulomb force, gradient force, and Johnsen-Rahbek force. In the present embodiment, when the wafer W is an insulator, the wafer W is sucked to the wafer placement surface 4a mainly by the gradient force. In order to generate gradient force, it is preferable to reduce the linewidth w and the interelectrode distance d as much as possible. With the wafer W sucked to the wafer placement surface 4a, the inside of the chamber is set to a predetermined vacuum atmosphere (or a reduced-pressure atmosphere), and while a process gas is being supplied from a shower head (not shown) provided on the ceiling surface of the chamber, a high-frequency power is supplied between an RF electrode (not shown) embedded in the plate 4 and the shower head, thus a plasma is generated. A CVD film is formed and etching is performed on the wafer by utilizing the plasma.

With the electrostatic chuck 2 of the present embodiment described above, it is not necessary for the positive electrode 6 and the negative electrode 8 to avoid the lift pin holes 10, 20, 30 along an arc shape around the lift pin holes, the regularity of the electrode pattern can be maintained favorably, and the difference in density of disposition of electrodes can also be reduced. Therefore, it is possible to reduce the variation in suction power in the wafer placement surface 4a.

The diameter $\varphi$ of the lift pin holes 10, 20, 30 is greater than or equal to the interelectrode distance d. In this case, when a lift pin hole is attempted to be provided between the positive electrode 6 and the negative electrode 8 adjacent to each other, at least one of the positive electrode 6 and the negative electrode 8 interferes with the lift pin hole, thus needs to detour the lift pin hole. Therefore, the significance of application of the present invention is high.

Note that the present invention is not limited to the embodiment described above, and it goes without saying that the present invention can be implemented in various modes as long as the present invention belongs to the technical scope of the invention.

For example, in the embodiment described above, a plurality of gas supply holes penetrating the plate 4 in a thickness direction may be provided. Each gas supply hole is for supplying a gas (for example, He gas) for heat conduction to the rear surface of the wafer W, and the diameter is assumed to be less than the interelectrode distance d. Thus, the gas supply hole can be provided between the positive electrode 6 and the negative electrode 8 adjacent to each other.

In the embodiment described above, a heater electrode (resistance heating element) may be embedded in the plate 4, and the temperature of the wafer W may be controlled by controlling the electrical power to be supplied to the heater electrode. Alternatively, the plate 4 may be divided into a plurality of zones, and heater electrodes may be provided separately for each of the zones. In this manner, the temperature can be controlled for each zone.

In the embodiment described above, the diameter φ of the lift pin holes 10, 20, 30 is set to be greater than or equal to the interelectrode distance d. However, the diameter φ may be less than the interelectrode distance d. Even when the diameter φ is less than the interelectrode distance d, if it is difficult to provide a lift pin hole between the positive electrode 6 and the negative electrode 8 adjacent to each other, there is significance in applying the present invention.

In the embodiment described above, the lift pin holes 10, 20, 30 have been exemplified as the through holes of the present invention. However, each through hole is not particularly limited to the lift pin hole. For example, the above-mentioned gas supply hole may be a through hole of the present invention. Particularly, when the interelectrode distance d between the adjacent positive electrode 6 and negative electrode 8 is small, it may be not possible to provide a gas supply hole between the adjacent positive electrode 6 and negative electrode 8, thus there is significance in using a gas supply hole as the through hole of the present invention.

In the embodiment described above, the positive electrode 6 may be changed to a negative electrode, and the negative electrode 8 may be changed to a positive electrode. In this case, the negative helical electrode portions are connected via outer circumferential portions, and the positive helical electrode portions are connected via a central portion of the plate 4.

In the embodiment described above, a cooling plate made of metal may be attached to the rear surface (the surface on the opposite side to the wafer placement surface 4a) of the plate 4 of the electrostatic chuck 2. A cooling medium flow path may be provided inside the cooling plate.

In the embodiment described above, the shape of the plate 4 is a circle, however, is not particularly limited to a circle, and may be a rectangle or a square, for example.

In the embodiment described above, the case has been exemplified, where the plate 4 is provided with the three lift pin holes 10, 20, 30, however, the plate 4 may be provided with four or more lift pin holes. For example, when the plate 4 is provided with four lift pin holes, four division areas are present, and their shape is a sector having a central angle of approximately 90°.

In the embodiment described above, three lift pin holes 10, 20, 30 are provided equally spaced on a circle concentric with the plate 4. However, without being particularly limited to this, for example, three lift pin holes may be provided at positions deviated from a circle concentric with the plate 4 or provided unequally spaced on a circle concentric with the plate 4.

The present application claims priority from Japanese Patent Application No. 2019-050246, filed on Mar. 18, 2019, the entire contents of which are incorporated herein by reference.

What is claimed is:

1. An electrostatic chuck comprising:
a ceramic plate having a wafer placement surface;
a plurality of through holes which penetrate the plate in a thickness direction; and
a pair of positive and negative electrodes provided in the plate to generate an electrostatic force,
wherein the plate has division areas virtually divided, which are equal in number to a number of the through holes,
the pair of positive and negative electrodes have pairs of positive and negative helical electrode portions, and for each of the division areas, one of the pairs of positive and negative helical electrode portions is provided in parallel to each other so as to cover an entirety of the division area from each of a positive electrode start point and a negative electrode start point, and wherein the positive electrode start point and the negative electrode start point for each division area are proximate to the through hole for the division area and with the through hole for each division area located between the positive electrode start point and the negative electrode start point in a circumferential direction of the plate,
the positive electrode of the pair of positive and negative electrodes is such that the positive helical electrode portions of the division areas are connected via either one of a triangular shaped connection portion provided at a central portion and an annular shaped connection portion provided at outer circumferential portions of the plate, and
the negative electrode of the pair of positive and negative electrodes is such that the negative helical electrode portions of the division areas are connected via the other of the triangular shaped connection portion provided at the central portion and the annular shaped connection portion provided at the outer circumferential portions of the plate.

2. The electrostatic chuck according to claim 1, wherein a diameter of the plurality of through holes is greater than an interelectrode distance between the positive electrode and the negative electrode adjacent to each other.

3. The electrostatic chuck according to claim 2, wherein a linewidth of the positive electrode is equal to a linewidth of the negative electrode.

4. The electrostatic chuck according to claim 3,
wherein the plate is circular,
the plurality of through holes are provided equally spaced on a circle concentric with the plate, and
the division areas are such that the plate is equally divided by line segments in a radial direction of the plate into the division areas which are equal in number to a number of the plurality of through holes.

5. The electrostatic chuck according to claim 2, wherein the plate is circular,
the plurality of through holes are provided equally spaced on a circle concentric with the plate, and
the division areas are such that the plate is equally divided by line segments in a radial direction of the plate into the division areas which are equal in number to a number of the plurality of through holes.

6. The electrostatic chuck according to claim 1, wherein the plate is circular,
the plurality of through holes are provided equally spaced on a circle concentric with the plate, and
the division areas are such that the plate is equally divided by line segments in a radial direction of the plate into the division areas which are equal in number to a number of the plurality of through holes.

7. The electrostatic chuck according to claim 1, wherein a diameter of the plurality of through holes is less than an interelectrode distance between the positive electrode and the negative electrode adjacent to each other.

8. The electrostatic chuck according to claim 1, wherein the plate is circular, and wherein the plurality of through holes are provided at positions deviated from a circle concentric with the plate.

9. The electrostatic chuck according to claim 1, wherein the helical shape of the helical electrode portions is substantially similar to a sector of the division area.

10. An electrostatic chuck comprising:
a ceramic plate having a wafer placement surface;
a plurality of through holes which penetrate the plate in a thickness direction; and
a pair of positive and negative electrodes provided in the plate to generate an electrostatic force,
wherein the plate has division areas virtually divided, which are equal in number to a number of the through holes,
the pair of positive and negative electrodes have pairs of positive and negative helical electrode portions, and for each of the division areas, one of the pairs of positive and negative helical electrode portions is provided in parallel to each other so as to cover an entirety of the division area from each of a positive electrode start point and a negative electrode start point, and wherein the positive electrode start point and the negative electrode start point for each division area are proximate to the through hole for the division area and with the through hole for each division area located between the positive electrode start point and the negative electrode start point in a circumferential direction of the plate,
the positive electrode of the pair of positive and negative electrodes is such that the positive helical electrode portions of the division areas are connected via either one of a central portion and outer circumferential portions of the plate, and
the negative electrode of the pair of positive and negative electrodes is such that the negative helical electrode portions of the division areas are connected via the other of the central portion and the outer circumferential portions of the plate, and
wherein the helical shape of the helical electrode portions is substantially similar to a sector of the division area.

* * * * *